(12) United States Patent
Kim

(10) Patent No.: US 7,675,023 B2
(45) Date of Patent: Mar. 9, 2010

(54) IMAGE SENSOR AND METHOD OF FABRICATING THE SAME

(75) Inventor: Sang Sik Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1105 days.

(21) Appl. No.: 11/319,494

(22) Filed: Dec. 29, 2005

(65) Prior Publication Data

US 2006/0146376 A1    Jul. 6, 2006

(30) Foreign Application Priority Data

Dec. 30, 2004  (KR) .................. 10-2004-0116516

(51) Int. Cl.
*H01J 5/16* (2006.01)
*H01J 5/02* (2006.01)

(52) U.S. Cl. ..................... 250/226; 250/239

(58) Field of Classification Search ............. 250/208.1, 250/214 R, 214.1, 226, 239; 348/294; 257/290–292, 257/431–440; 438/57, 64, 68–70
See application file for complete search history.

(56) References Cited

U.S. PATENT DOCUMENTS

| 7,153,720 | B2* | 12/2006 | Augusto | ..................... 438/69 |
| 7,498,574 | B2* | 3/2009 | Puscasu et al. | ........... 250/336.1 |
| 2003/0221608 | A1* | 12/2003 | Mori | .............................. 117/2 |

FOREIGN PATENT DOCUMENTS

| KR | 10-0578683 | 3/2006 |
| WO | WO 98/53351 | 11/1998 |

* cited by examiner

*Primary Examiner*—Que T Le
*Assistant Examiner*—Jennifer Bennett
(74) *Attorney, Agent, or Firm*—McKenna Long & Aldridge LLP

(57) ABSTRACT

An image sensor and a method for fabricating the same are provided. The image sensor includes color filter layers having a photonic crystal for color separation. Since transmittance of the color filter layers is higher than that of a pigment or dye of an organic material and can easily be controlled in an unnecessary wavelength region, the image sensor having high sensitivity and good color reproduction can be fabricated.

11 Claims, 6 Drawing Sheets

IMAGE SENSOR AND METHOD OF FABRICATING THE SAME

This application claims the benefit of Korean Patent Application No. 10-2004-0116516, filed on Dec. 30, 2004, which is hereby incorporated by reference for all purposes as if fully set forth herein.

BACKGROUND OF THE INVENTION

1. Field of the Invention

The present invention relates to image sensors, and more particularly, to an image sensor including a color filter layer based on a photonic crystal for color separation and a method for fabricating the same.

2. Discussion of the Related Art

Generally, an image sensor is a semiconductor module that converts optical images to electrical signals. The image sensor stores and transmits image signals and displays them in a display device. The image sensor is classified into a charge-coupled device (CCD) and a complementary metal-oxide-semiconductor (CMOS) image sensor.

Both the CCD and the CMOS image sensor employ a photoelectric conversion device in an optical detecting mode. To display color for the image sensor, color filter layers are required on a photoelectric conversion device. That is, since the photoelectric conversion device does not discriminate between colors, color filter layers must be selectively formed per unit pixel to control color information. However, since color filter layers are formed of organic materials, it is difficult to form a precise pattern since process problems exist between deposited organic materials and the low resolution of a photoresist used by a dyeing method or a pigment dispersing method. Since color filtering characteristics of a pigment or dye are not ideal and exhibit low color transmittance, optical loss increases. This deteriorates output during input of external image information.

Further, complementary color filter layers or primary color filter layers separate or synthesize color information by combining three or four colors to input or output original images. However, to form three or four colors, color formation processes of three times or greater are required. Therefore, problems occur because processes are long and complicated and a great amount of subsidiary materials is required.

SUMMARY OF THE INVENTION

Accordingly, the present invention is directed to an image sensor and a method for fabricating the same that substantially obviates one or more problems due to limitations and disadvantages of the related art.

An advantage of the present invention is to provide an image sensor and a method for fabricating the same, in which color filter layers are formed using a photonic crystal to obtain a simple structure without space limitation. The layers required for process steps are reduced to obtain color filter layers having high quality.

Additional features and advantages of the invention will be set forth in the description which follows, and in part will be apparent from the description or may be learned from practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described herein, there is provided an image sensor comprising color filter layers having a photonic crystal for color separation.

In another aspect of the present invention, the photonic crystal is comprised of a grid pattern of a material having a refractive index different than that of an inner material.

In another aspect of the present invention, there is provided a method for fabricating an image sensor. The method comprises forming a planarization layer for color filter layers on a light-transmitting layer that transmits light received in a photodiode on a silicon substrate; sputtering or depositing a gold layer on the planarization layer; depositing a first photoresist layer on the gold layer to form a grid pattern using etching; performing isotropic etching in the gold layer; stripping the first photoresist layer; etching or selectively growing a portion other than the grid pattern of the gold layer to form a trench; filling a material having different refractive indexes in the trench; depositing a second photoresist layer; and planarizing the second photoresist layer using a dry etch-back process, thereby forming the color filter layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
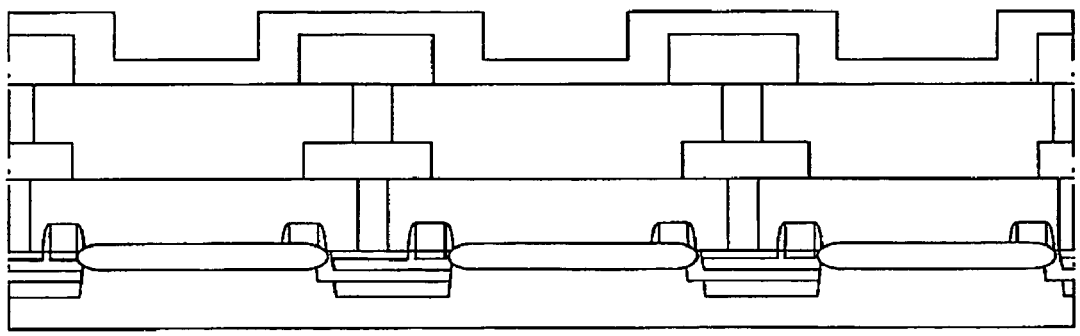
FIG. 1 is a vertical structural view of an image sensor according to the present invention, illustrating a black-and-white process of the image sensor.

An image sensor according to the present invention is provided with a photonic crystal layer as a color filter, which is formed in the image sensor using an on-chip technology to enable color filtering, that is, to enable color separation. The image sensor can be formed by process steps similar to those of a typical CMOS or CCD image sensor. Such an image sensor includes a photodiode for photoelectric conversion formed on a silicon substrate, a patterned metal wiring layer, a plurality of gates, interconnecting lines for controlling and reading the electrical signals of the photodiode, and a metal line serving as a light-shielding layer. These basic components are formed by basic steps known as a black-and-white process. In a black-and-white process, the photodiodes do not facilitate color separation, as photodiodes are grayscale devices. Thus, in patterning the metal line to fabricate the image sensor, a step corresponding to generating a thickness of the metal lines is performed, as shown in FIG. 1.

Figure 2:
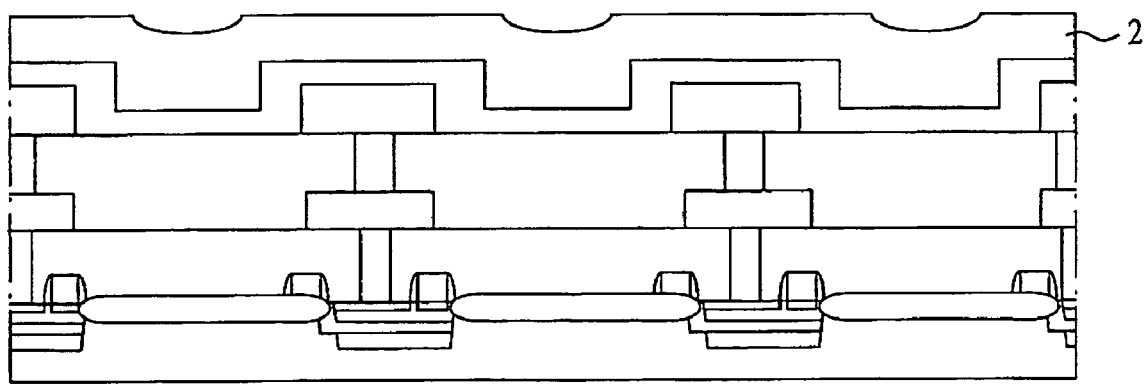
FIG. 2 is a vertical structural view of an image sensor according to the present invention, illustrating a passivation layer to be planarized.

Referring to FIG. 2, a passivation layer using a silicon dioxide or silicon nitride is formed. This protects the device and improves reliability. The passivation layer is then planarized to improve uniformity and to facilitate the subsequent formation of the remainder of the structure, such as inner lenses and color filters. That is, a planarization layer 2 is formed using a material exhibiting good transmittance of visible wavelengths and a proper refractive index. In an embodiment of the present invention, the planarization layer 2 is a silicon dioxide material formed to a thickness of 0.5 μm to 2.0 μm.

Figure 3:
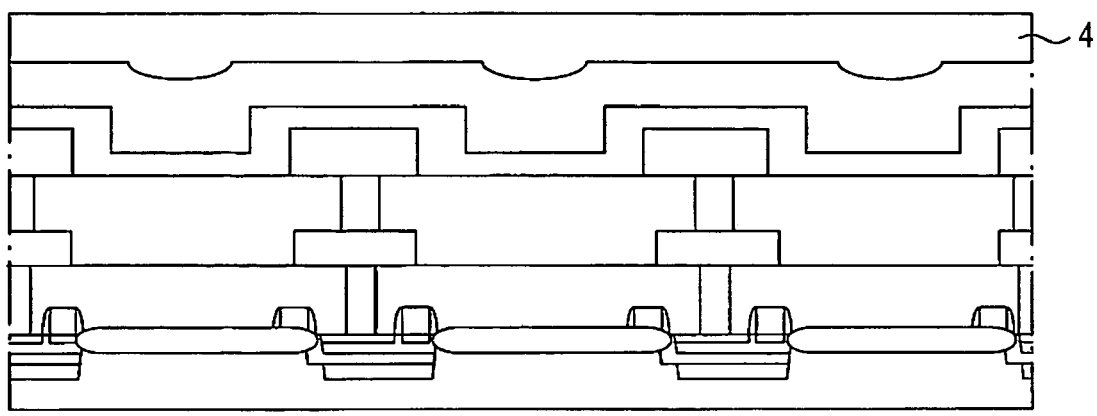
FIG. 3 is a vertical structural view of an image sensor according to the present invention, illustrating a deposition of a photoresist for planarization.

Referring to FIG. 3, a photoresist layer 4 is deposited at a thickness of 1.0 μm to 0.5 μm and then planarized by chemical-mechanical polishing or a dry etch-back process.

Figure 4:
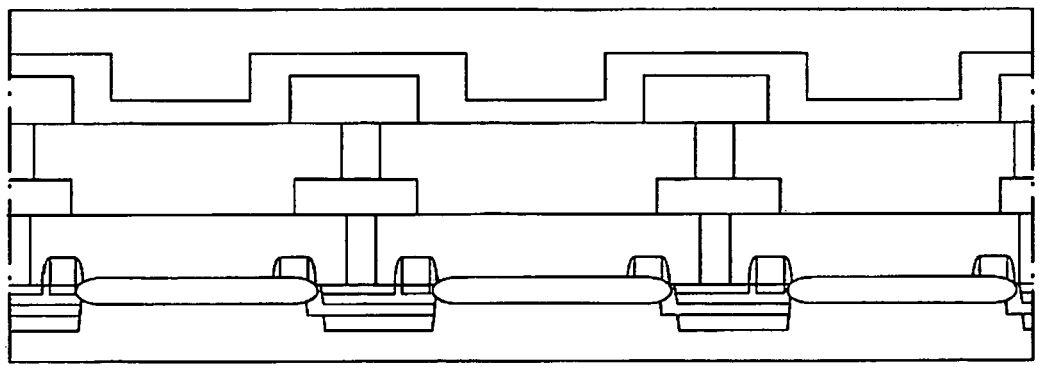
FIG. 4 is a vertical structural view of an image sensor according to the present invention, illustrating a planarized surface.

The completion of planarization is shown in FIG. 4.

Figure 5:
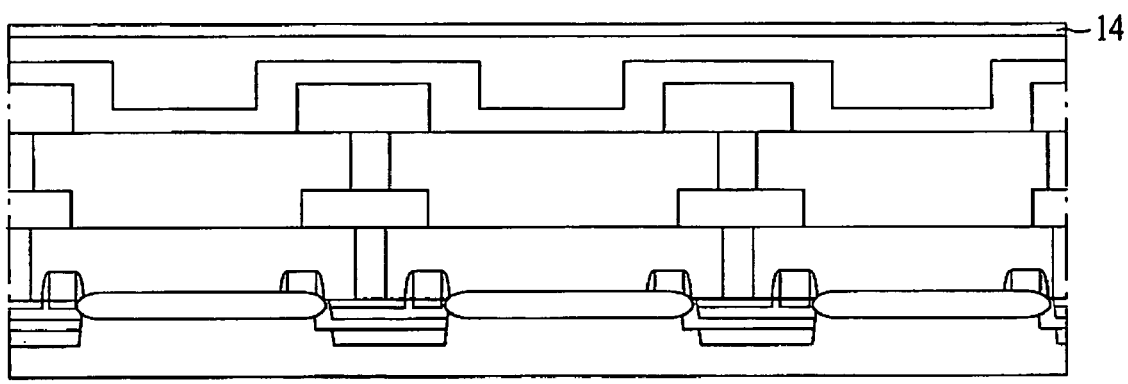
FIG. 5 is a vertical structural view of an image sensor according to the present invention, illustrating a deposition of gold.

As shown in FIG. 5, gold is sputtered or deposited to form a deposition layer 14.

Figure 6:
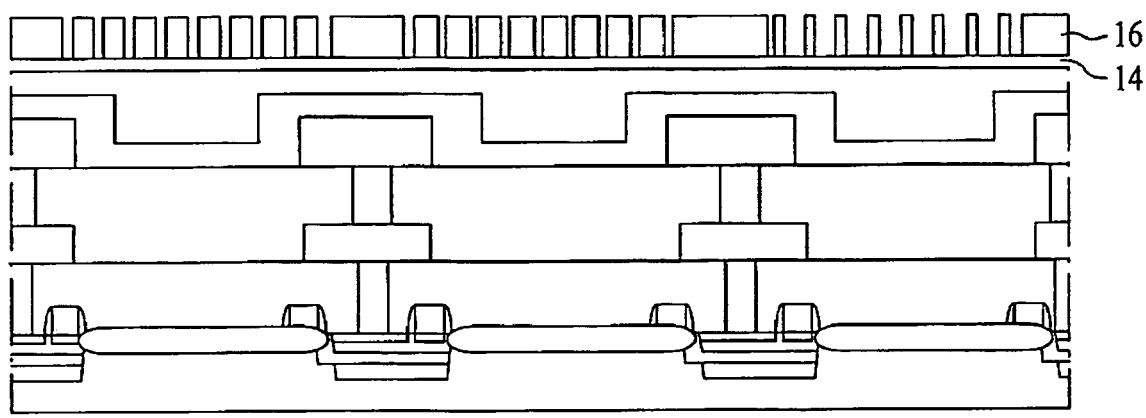
FIG. 6 is a vertical structural view of an image sensor according to the present invention, illustrating a deposition of a photoresist for forming a gold pattern.

As shown in FIG. 6, a photoresist is deposited on the deposition layer 14 to form a photoresist pattern 16 using electron-beam lithography or another known lithography technology. The photoresist pattern 16 transfers color information per pixel in accordance with a fixed rule. That is, images are formed of red, blue, and green pixels of fixed positions.

Figure 7:
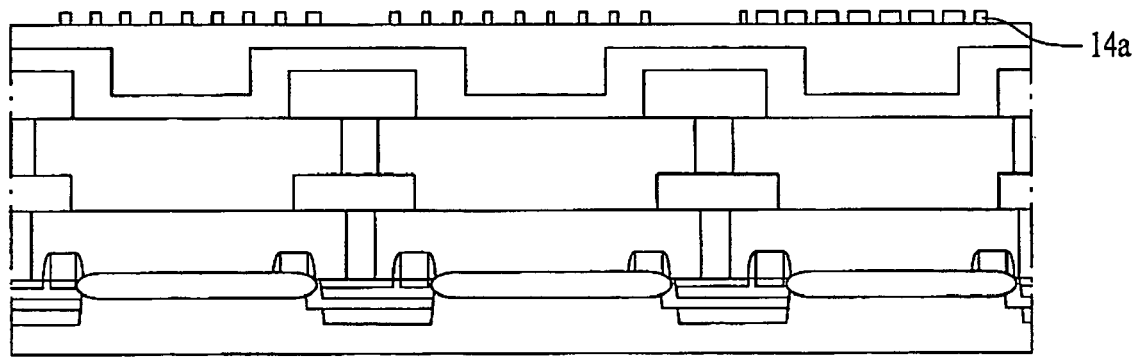
FIG. 7 is a vertical structural view of an image sensor according to the present invention, illustrating a formation of the gold pattern.

As shown in FIG. 7, after forming the photoresist pattern 16, anisotropic etching is performed on the deposition layer 14, i.e., the gold layer, using the photoresist pattern 16 as a mask, which is thereafter stripped away. Thus, a gold pattern 14a is formed on the silicon dioxide of the planarization layer 2. That is, an oxide layer is exposed between the patterns of the gold, corresponding to the color information per pixel. The color information is obtained by a simulation formed by arranging a photonic crystal on a nano-scale. That is, it is possible to selectively transmit and reflect visible wavelengths by controlling the thickness, height, width, and arrangement interval of the oxide layer. The gold pattern 14a remains to use a period of a defect.

Figure 8:
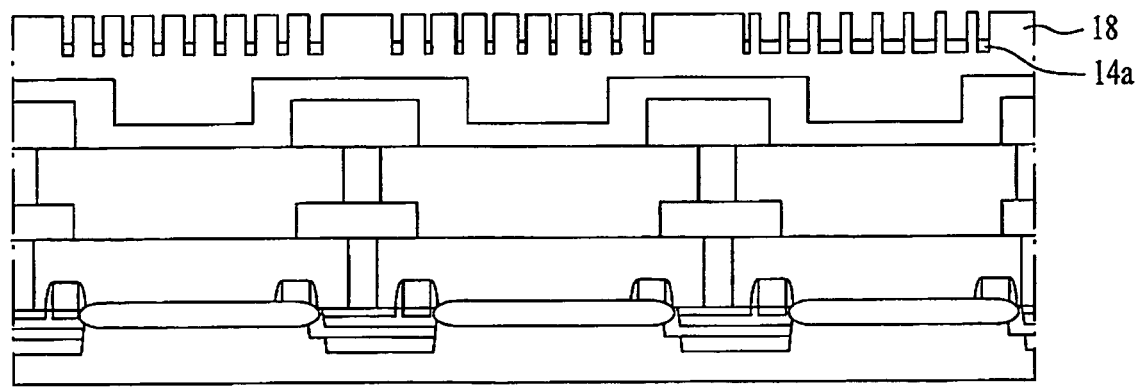
FIG. 8 is a vertical structural view of an image sensor according to the present invention, illustrating a selective oxidation.

As shown in FIG. 8, the oxide of the oxide layer is grown to a thickness of 0.5-2.0 μm, to form an oxide growth layer 18, which includes a series of trenches corresponding to the gold pattern 14a.

Figure 9:
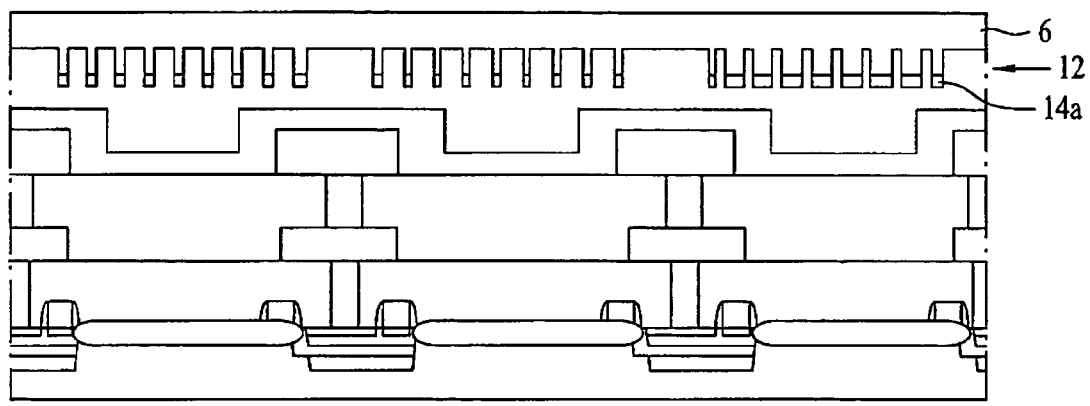
FIG. 9 is a vertical structural view of an image sensor according to the present invention, illustrating a filling of a gap.

The trenches are filled with a layer 6 of a silicon nitride metal or other material having a refractive index greater than that of the oxide when the gold pattern is removed or remains, to obtain a photonic crystal structure 12. The photonic crystal structure 12 is comprised of a grid pattern of a material having a refractive index different than that of an inner material, as shown in FIG. 9. As an alternative to the above-mentioned oxide layer, a monocrystal material may be used. The monocrystal material obtains the same effect as that of the oxide.

In another embodiment, after the gold pattern 14a is formed, the oxide layer is formed by selective anisotropic etching using the gold pattern 14a as a mask.

Figure 10:
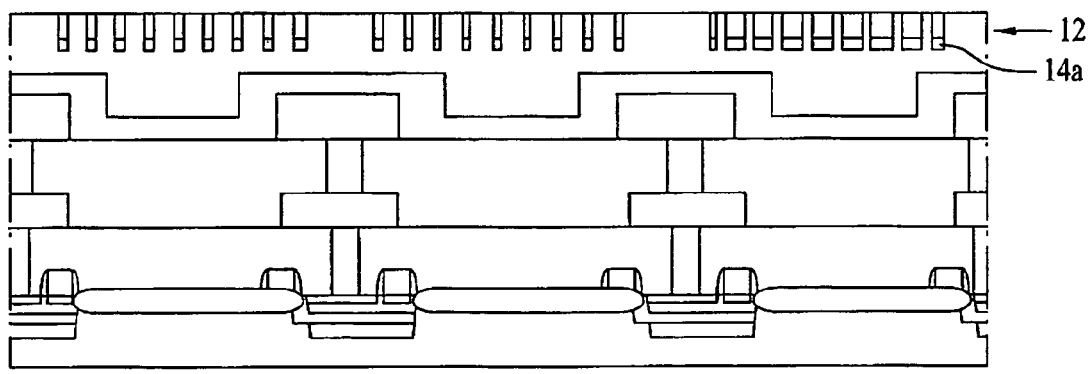
FIG. 10 is a vertical structural view of an image sensor according to the present invention, illustrating a filling of an etched-back gap.

After the trenches or gaps are filled, photoresist (not shown) is deposited and planarization is performed by a dry etch-back process, as shown in FIG. 10.

Figure 11:
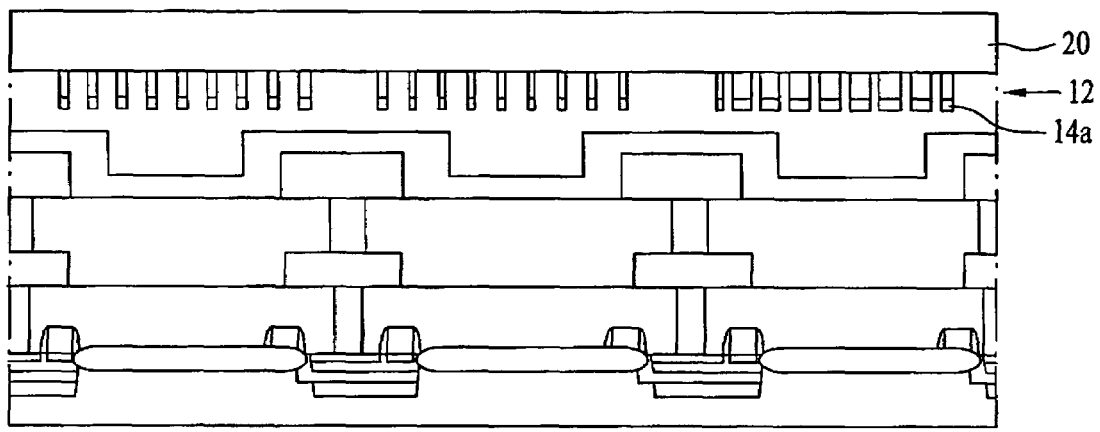
FIG. 11 is a vertical structural view of an image sensor according to the present invention, illustrating a formation of an overcoat layer.

As shown in FIG. 11, an overcoat layer 20 is formed by depositing a polyimide material on the planarization layer to a thickness of 0.5-2.0 μm and performing curing based on an annealing process. The polyimide material controls a focal length and has a good transmittance of visible wavelengths.

Each color filter is designed so that the gold pattern 1 4a is arranged in a triangle shape. The size and arrangement interval of the pattern depend on the color of the filter, i.e., the wavelength of light to be passed through the filter.

Figure 12:
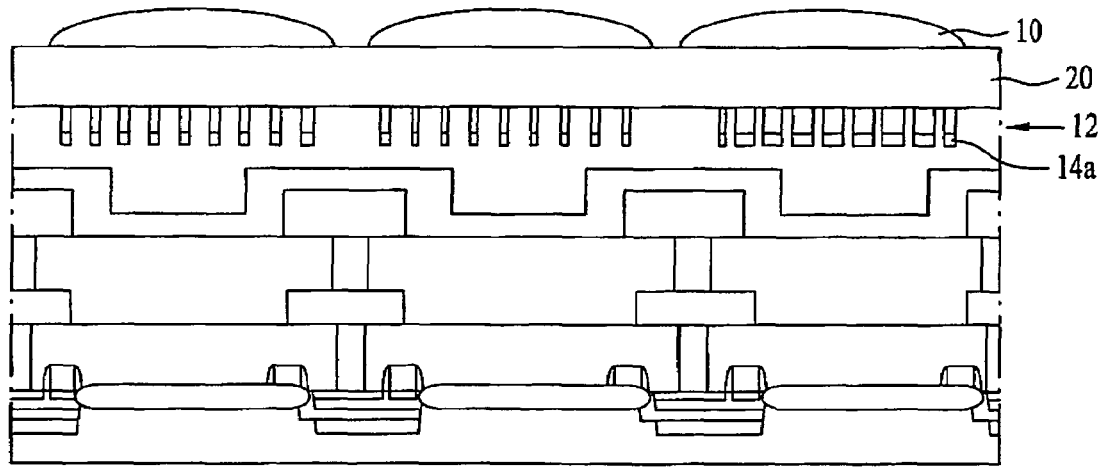
FIG. 12 is a vertical structural view of an image sensor according to the present invention, illustrating a formation of microlenses on the overcoat layer.

As shown in FIG. 12, a plurality of microlenses 10 is formed on the overcoat layer 20 by a conventional microlens formation process. Thus, the photonic crystal layer 12 is formed as a color filter layer provided below the microlenses 10.

According to photonic band gap principles, light having a wavelength similar to a grid size of a grid crystal is not transmitted to the inner side of a photonic crystal, due to the overlap of interference between light that is scattered in the photonic crystal by regular grids when light is irradiated. That is, the irradiated light is completely reflected as long as the photonic crystal does not absorb the light. Such interference of the scattered light can be interpreted using Maxwell's equation of electromagnetic propagation.

The photonic crystal has a photonic band gap and a defect mode corresponding to one of its features. The defect mode is used in most fields based on the photonic crystal. The defect mode is locally generated by locally breaking periodicity in the photonic crystal to intentionally generate a defect. The frequency of the defect mode can be controlled depending on how the defect mode is designed. The defect mode is determined by the size of a gold pattern and its periodical arrangement. The defect mode can be designed through a simulation such that only red, green, and blue are reflected and other colors are transmitted.

By adopting the image sensor and the method for fabricating the same according to the present invention, it is possible to reduce material costs and processing errors since the color filter layers are formed at one time by a short process. Also, since transmittance of the color filter layers is higher than that of a pigment or dye of an organic material and can easily be controlled in an unnecessary wavelength region, the image sensor having high sensitivity and good color reproduction can be fabricated.

It will be apparent to those skilled in the art that various modifications and variation can be made in the present invention without departing from the spirit or scope of the invention. Thus, it is intended that the present invention cover the modifications and variation of this invention provided they come within the scope of the appended claims and their equivalents.

What is claimed is:

1. A method for fabricating an image sensor comprising:
   forming a planarization layer for color filter layers on a light-transmitting layer that transmits light received in a photodiode on a silicon substrate;
   sputtering or depositing a gold layer on the planarization layer;
   depositing a first photoresist layer on the gold layer to form a grid pattern using etching;
   performing isotropic etching in the gold layer;
   stripping the first photoresist layer;
   etching or selectively growing a portion other than the grid pattern of the gold layer to form a trench;
   filling a material having different refractive indexes in the trench;
   depositing a second photoresist layer; and
   planarizing the second photoresist layer using a dry etch-back process, thereby forming the color filter layers.

2. The method of claim 1, wherein the planarization layer is made of silicon dioxide and wherein the material filling the trench is silicon nitride.

3. The method of claim 1, wherein the trench is formed by selectively growing silicon monocrystal on the grid pattern.

4. The method of claim 1, wherein the trench is formed by selectively growing silicon dioxide on the grid pattern.

5. The method of claim 1, wherein the color filter layers have a photonic crystal for color separation.

6. The method of claim 1, further comprising forming a plurality of microlenses.

7. The method of claim 1, further comprising:
   depositing a polyimide material on the planarization layer; and
   performing curing based on an annealing process.

8. The method of claim 1, wherein the etching used in depositing a first photoresist layer on the gold layer to form a grid pattern is electron—beam etching.

9. The method of claim 1, further comprising forming a third photoresist after forming a planarization layer and before sputtering or depositing a gold layer.

10. The method of claim 9, further comprising planarizing the third photoresist using a dry-etch back process.

11. The method of claim 9, further comprising planarizing the third photoresist using chemical-mechanical polishing.

* * * * *